United States Patent
Pang et al.

(10) Patent No.: US 12,348,606 B2
(45) Date of Patent: Jul. 1, 2025

(54) CLOCK FREQUENCY DEVIATION DETECTOR WITH CLOSED-LOOP CALIBRATION

(71) Applicant: QUALCOMM Incorporated, San Diego, CA (US)

(72) Inventors: Bo Pang, Carlsbad, CA (US); Andrew Weil, San Diego, CA (US); Matthew Chauncey Kusbit, Santee, CA (US); Mahmoud Elhebeary, San Diego, CA (US); Benjamin Griffitts, Santa Ana, CA (US); Xiaohong Quan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 19 days.

(21) Appl. No.: 18/184,341

(22) Filed: Mar. 15, 2023

(65) Prior Publication Data
US 2024/0313939 A1    Sep. 19, 2024

(51) Int. Cl.
*H04L 7/00* (2006.01)
(52) U.S. Cl.
CPC ................................. *H04L 7/0016* (2013.01)
(58) Field of Classification Search
CPC ....................................................... H04L 7/0016
See application file for complete search history.

(56) References Cited

U.S. PATENT DOCUMENTS

| | | | |
|---|---|---|---|
| 6,141,163 A * | 10/2000 | Nakamura | ............... G11B 5/09 |
| 7,714,619 B2 | 5/2010 | Yamada | |
| 2010/0141233 A1* | 6/2010 | Kwok | .................... H04B 15/00 |
| | | | 323/351 |
| 2010/0219865 A1 | 9/2010 | Huang | |
| 2015/0229212 A1* | 8/2015 | Shiwaya | ............... H02M 3/158 |
| | | | 323/282 |
| 2016/0308516 A1 | 10/2016 | Narayan et al. | |
| 2017/0111036 A1 | 4/2017 | Seo et al. | |

OTHER PUBLICATIONS

Machine translation of CN-114489234-A (Year: 2022).*
Partial International Search Report—PCT/US2024/016857—ISA/EPO—Jul. 1, 2024.
International Search Report and Written Opinion—PCT/US2024/016857—ISA/EPO—Aug. 23, 2024.

* cited by examiner

*Primary Examiner* — Jean B Corrielus
(74) *Attorney, Agent, or Firm* — Loza & Loza, LLP

(57) ABSTRACT

An apparatus, including: a switched capacitor configured to generate a switched capacitor voltage based on an input clock signal and a current; a current digital-to-analog converter (DAC) configured to generate the current based on a first digital signal; a first reference voltage generator configured to generate a first reference voltage; and a first voltage comparing device configured to generate a first frequency deviation detection signal based on a comparison of the switched capacitor voltage to the first reference voltage.

29 Claims, 4 Drawing Sheets

CLOCK FREQUENCY DEVIATION DETECTOR WITH CLOSED-LOOP CALIBRATION

FIELD

Aspects of the present disclosure relate generally to clock frequency monitoring, and in particular, to a clock frequency deviation detector with closed-loop calibration.

BACKGROUND

A clock signal, which may be a periodic oscillating signal, may be provided to one or more circuits for sequentially controlling their operations. The frequency at which the clock signal cycles may affect the performance and operations of the circuits. Accordingly, the frequency of a clock signal is typically specified to be substantially at a target frequency or within a target frequency range. Monitoring the frequency of the clock signal may be performed to determine whether the frequency is within specification or has deviated from the specification.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a switched capacitor configured to generate a switched capacitor voltage based on an input clock signal and a current; a current digital-to-analog converter (DAC) configured to generate the current based on a first digital signal; a first reference voltage generator configured to generate a first reference voltage; and a first voltage comparing device configured to generate a first frequency deviation detection signal based on a comparison of the switched capacitor voltage to the first reference voltage.

Another aspect of the disclosure relates to a method. The method includes generating a current based on a digital signal; generating a first voltage based on an input clock signal and the current; generating a second voltage; and generating a first frequency deviation detection signal based on a comparison of the first and second voltages.

Another aspect of the disclosure relates to an apparatus. The apparatus includes means for generating a current based on a digital signal; means for generating a first voltage based on an input clock signal and the current; means for generating a second voltage; and means for generating a first frequency deviation detection signal based on a comparison of the first and second voltages.

Another aspect of the disclosure relates to a wireless communication device. The wireless communication device includes: at least one antenna; a transceiver coupled to the at least one antenna; a set of one or more signal processing cores coupled to the transceiver; a clock source coupled to the set of one or more signal processing cores; and a frequency deviation detector coupled to the clock source, wherein the frequency deviation detector comprises: a switched capacitor configured to generate a switched capacitor voltage based on an input clock signal and a current; a current digital-to-analog converter (DAC) configured to generate the current based on a digital signal; a reference voltage generator configured to generate a reference voltage; and a voltage comparing device configured to generate a frequency deviation detection signal based on a comparison of the switched capacitor voltage to the reference voltage.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
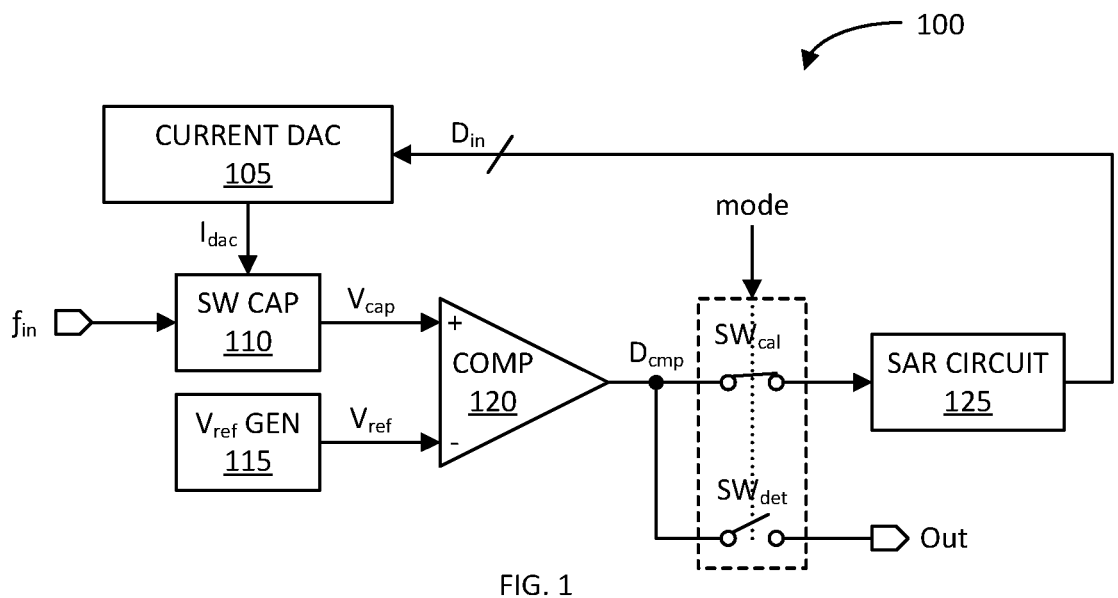
FIG. 1 illustrates a block diagram of an example low-side clock frequency deviation detector in accordance with an aspect of the disclosure.

FIG. 1 illustrates a block diagram of an example clock frequency deviation detector 100 in accordance with an aspect of the disclosure. The clock frequency deviation detector 100 is configured to generate an output signal $D_{cmp}$ indicative of whether an input clock signal $f_{in}$ has deviated in frequency (e.g., decreased below) a target frequency. In particular, the clock frequency deviation detector 100 includes a current digital-to-analog converter (DAC) 105, a switched capacitor 110, a reference voltage generator 115, a comparator 120, a set/pair of switching devices $SW_{cal}$ and $SW_{det}$, and a successive approximation register (SAR) circuit 125.

The switched capacitor 110 is configured to generate a switched capacitor voltage $V_{cap}$ based on the input clock signal $f_{in}$ and a current $I_{dac}$ generated by the current DAC 105. For example, the switched capacitor 110 may include a T-circuit configuration including a pair of series switching devices and a shunt capacitor between the switching devices. The pair of switching devices are complementary or oppositely driven to on/off states by substantially opposite phases of the input clock signal $f_{in}$, respectively. The DAC current $I_{dac}$ is applied to one side or input of the T-circuit configuration, and the switched capacitor voltage $V_{cap}$ is produced at the opposite side or output of the T-circuit configuration. The switched capacitor voltage $V_{cap}$ may be given by the following equation: $V_{cap}=I_{dac}/(C*f_{in})$, where C is the capacitance of the shunt capacitor, $I_{dac}$ is the current generated by the current DAC 105, and $f_{in}$ also represents the frequency of the input clock signal $f_{in}$.

The reference voltage generator 115, which may be implemented as or based on a bandgap voltage generator, is configured to generate a reference voltage $V_{ref}$. As the reference voltage $V_{ref}$ may be based on a bandgap voltage, it may be substantially process-voltage-temperature (PVT) insensitive. The comparator 120 includes positive (+) and negative (−) inputs coupled to the switched capacitor 110 and reference voltage generator 115 to receive the switched capacitor voltage $V_{cap}$ and the reference voltage $V_{ref}$, respectively. In this configuration, the clock frequency deviation detector 100 is configured to detect frequency deviation that falls or decreases below a target frequency. However, as discussed in more detail further herein, it shall be understood that the clock frequency deviation detector 100 may be configured to detect frequency deviation that rises or increases above a target frequency, for example, by having the switched capacitor voltage $V_{cap}$ and the reference voltage $V_{ref}$ applied to the negative (−) and positive (+) inputs of the comparator 120, respectively.

The comparator 120 is configured to generate a digital or logic signal $D_{cmp}$ based on a comparison of the switched capacitor voltage $V_{cap}$ to the reference voltage $V_{ref}$. For example, in general, if the switched capacitor voltage $V_{cap}$ is lower than the reference voltage $V_{ref}$, the comparator 120 may generate the signal $D_{cmp}$ as a logic zero (0) (e.g., generally, a first logic value). If the switched capacitor voltage $V_{cap}$ is higher than the reference voltage $V_{ref}$, the comparator 120 may generate the signal $D_{cmp}$ as a logic one (1) (e.g., generally, a second logic value complementary to the first logic value).

The comparator 120 may be a hysteresis comparator, implemented with hysteresis thresholds: a high hysteresis threshold $TH_H=V_{ref}+\Delta V$ and a low hysteresis threshold $TH_L=V_{ref}-\Delta V$, where $2\Delta V$ defines a hysteresis window. So, in this case, if the switched capacitor voltage $V_{cap}$ is lower than the low hysteresis threshold $TH_L$, the comparator 120 may generate the signal $D_{cmp}$ as a logic zero (0) (e.g., generally, a first logic value). If the switched capacitor voltage $V_{cap}$ is higher than the high hysteresis threshold $TH_H$, the comparator 120 may generate the signal $D_{cmp}$ as a logic one (1) (e.g., generally, a second logic value complementary to the first logic value). And, if the switched capacitor voltage $V_{cap}$ is between the low and high hysteresis thresholds $TH_H$ and $TH_L$, the comparator 120 may maintain signal $D_{cmp}$ at the current logic level. A reason for the hysteresis thresholds is that the switched capacitor voltage $V_{cap}$ may be sawtooth waveform in nature due to the switching operation of the switched capacitor 110 in response to the input clock signal $f_{in}$. Accordingly, the hysteresis thresholds prevent or reduce false positives if it toggles above and below one of the hysteresis thresholds.

The on/off states of the set/pair of switching devices $SW_{cal}$ and $SW_{det}$ are responsive to a mode signal indicating calibration or detection mode of operation. For example, if the mode signal indicates a calibration mode of operation, the switching device $SW_{cal}$ is on or closed, and the switching device $SW_{det}$ is off or open. In the calibration mode, the switching device $SW_{cal}$ routes the comparator output signal $D_{cmp}$ to the SAR circuit 125 for calibration purposes. Conversely, if the mode signal indicates detection mode of operation, the switching device $SW_{cal}$ is off or open, and the switching device SW det is on or closed. In detection mode, the switching device $SW_{det}$ outputs the comparator output signal $D_{cmp}$ to an external circuit for frequency deviation monitoring of the input clock signal $f_{in}$.

In accordance with calibration mode, a clock signal with a target frequency (e.g., a specification or calibration clock signal $f_{cal}$) is provided as the input clock signal $f_{in}$ for the clock frequency deviation detector 100. The SAR circuit 125 is configured to initially generate a DAC input signal $D_{in}$ at midlevel (e.g., $D_{in}$=128 or 1000000 for an 8-bit $D_{in}$ signal). In response to $D_{in}$, the current DAC 105 generates the current $I_{dac}$ corresponding to the initial midlevel, and the switched capacitor 110 generates the voltage $V_{cap}$ based on the DAC current $I_{dac}$ and the target frequency $f_{cal}$ of the specification clock signal (e.g., $V_{cap}=I_{dac}/(C*f_{cal})$). The SAR circuit 125 performs a closed-loop successive approximation of the DAC input signal $D_{in}$ to resolve its bits (e.g., from most significant bit (MSB) to least significant bit (LSB)) until the switched capacitor voltage $V_{cap}$ is substantially the same as (e.g., no more than one (1) LSB of) the reference voltage $V_{ref}$.

When calibrated and operating in detection mode, a clock signal $f_{core}$ to monitor is provided as the input clock signal $f_{in}$ for the clock frequency deviation detector 100. If the frequency of the monitored clock signal $f_{core}$ is not deviated or within specification (e.g., $f_{core}>f_{cal}$ and $V_{cap}<V_{ref}$), the comparator 120 generates the signal $D_{cmp}$ as a logic zero (0) (e.g., generally, a first logic value). If the frequency of the monitored clock signal $f_{core}$ deviates from specification (e.g., $f_{core}<f_{cal}$ and $V_{cap}>V_{ref}$), the comparator 120 generates the signal $D_{cmp}$ as a logic one (1) (e.g., generally, a second logic value complementary to the first logic value). The comparator signal $D_{cmp}$ is provided to an external circuit via the turned-on switching device $SW_{det}$ for monitoring and/or responding purposes.

Figure 2:
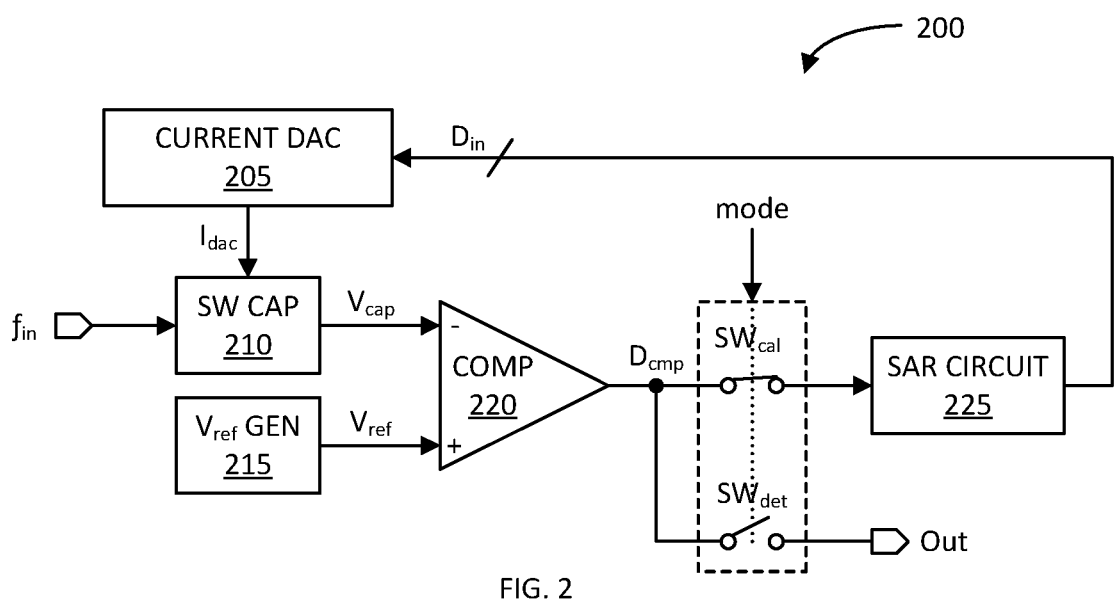
FIG. 2 illustrates a block diagram of an example high-side clock frequency deviation detector in accordance with another aspect of the disclosure.

FIG. 2 illustrates a block diagram of another example clock frequency deviation detector 200 in accordance with another aspect of the disclosure. The clock frequency deviation detector 200 is a variation of clock frequency deviation detector 100. Accordingly, the clock frequency deviation detector 200 includes the same/similar elements as clock frequency deviation detector 100 identified by the same reference numbers except that the most significant digit is a "2" for clock frequency deviation detector 200 instead of a "1" for clock frequency deviation detector 100.

As previously discussed, the clock frequency deviation detector 100 detects frequency deviation if the frequency $f_{core}$ of the monitored clock signal falls or decreases below the target frequency f cal (e.g., $f_{core}<$f cal, $V_{cap}>V_{ref}$, and $D_{cmp}$=1). That is, the clock frequency deviation detector 100 is a low-side frequency deviation detector. In contrast, the clock frequency deviation detector 200 is a high-side frequency deviation detector, and detects frequency deviation if the frequency $f_{core}$ of the monitored clock signal rises or increases above the target frequency $f_{cal}$ (e.g., $f_{core}>f$ cal, $V_{cap}<V_{ref}$, and $D_{cmp}=1$). If the frequency f core of the monitored clock signal is below the target frequency f cal, the clock frequency deviation detector 200 generates the signal $D_{cmp}$ as logic zero (0), indicating no frequency deviation (e.g., $f_{core}<f_{cal}$, $V_{cap}>V_{ref}$, and $D_{cmp}=0$). To effectuate high-side frequency deviation detection, the switched capacitor 210 is coupled to the negative (−) input of the comparator 220 to provide the switched capacitor voltage $V_{cap}$ thereto; and the reference voltage generator 215 is coupled to the positive (+) input of the comparator 220 to provide the reference voltage $V_{ref}$ thereto.

Figure 3:
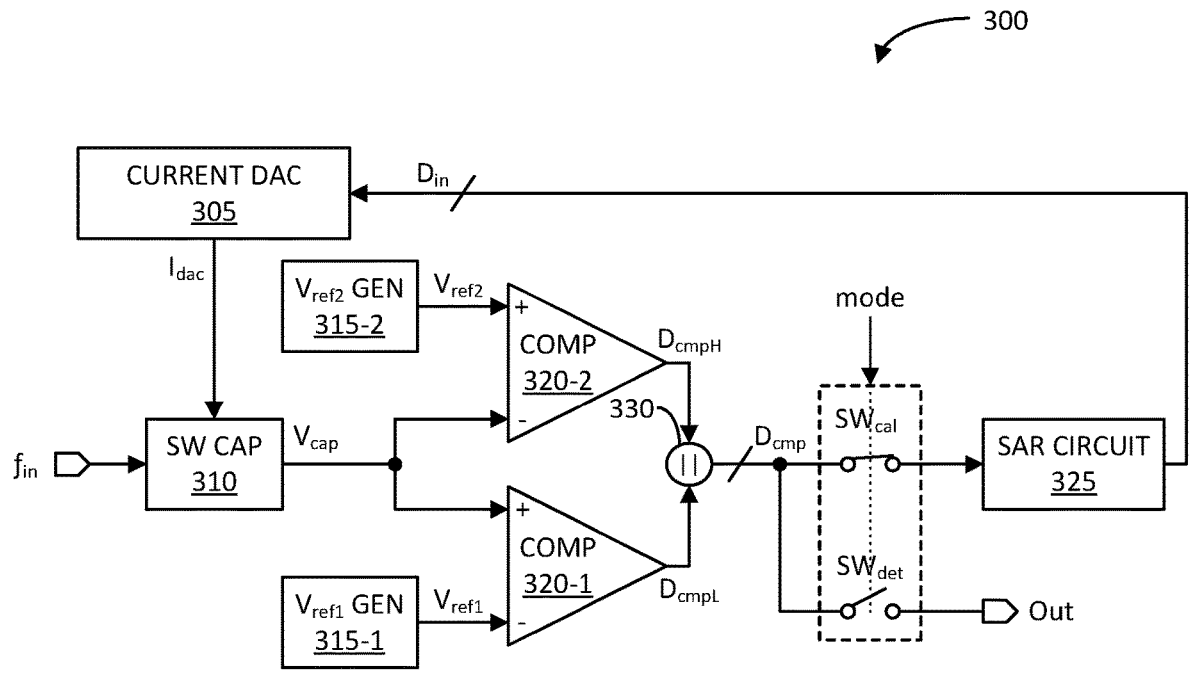
FIG. 3 illustrates a block diagram of an example high-side and low-side clock frequency deviation detector in accordance with another aspect of the disclosure.

FIG. 3 illustrates a block diagram of another example clock frequency deviation detector 300 in accordance with another aspect of the disclosure. The clock frequency deviation detector 300 is a variation of clock frequency deviation detectors 100 and 200. Accordingly, the clock frequency deviation detector 300 includes the same/similar elements as clock frequency deviation detectors 100 and 200 identified by the same reference numbers except that the most significant digit is a "3" for clock frequency deviation detector 300 instead of a "1" or "2" for clock frequency deviation detector 100 or 200, respectively.

As previously discussed, the clock frequency deviation detector 100 detects frequency deviation if the frequency f core of the monitored clock signal falls or decreases below the target frequency f cal (e.g., $f_{core}<f_{cal}$, $V_{cap}>V_{ref}$, and $D_{cmp}=1$). That is, the clock frequency deviation detector 100 is a low-side frequency deviation detector. Similarly, the clock frequency deviation detector 200 detects frequency deviation if the frequency $f_{core}$ of the monitored clock signal rises or increases above the target frequency f cal (e.g., $f_{core}>f_{cal}$, $V_{cap}<V_{ref}$, and $D_{cmp}=1$). That is, the clock frequency deviation detector 200 is a high-side frequency deviation detector.

The clock frequency deviation detector 300 is both a high-side and a low-side frequency deviation detector. That is, the clock frequency deviation detector 300 detects frequency deviation if the frequency $f_{core}$ of the monitored clock signal falls or decreases below a target frequency minus a certain margin of error $f_{cal}-\Delta f_1$ (e.g., $f_{core}<f_{cal}-\Delta f_1$, $V_{cap}>V_{ref1}$, and $D_{cmpL}=1$). The clock frequency deviation detector 300 also detects frequency deviation if the frequency f core of the monitored clock signal rises or increases above the target frequency plus a certain margin of error $f_{cal}+\Delta f_2$ (e.g., $f_{core}>f_{cal}+\Delta f_2$, $V_{cap}<V_{ref2}$, and $D_{cmpH}=1$). If the frequency f core of the monitored clock signal is within the margin of errors of the target frequency $f_{cal}$ (e.g., $f_{cal}-\Delta f_1<f_{cal}<f_{cal}+\Delta f_2$), the clock frequency deviation detector 300 generates an output signal $D_{cmp}$ as 00 (e.g., where $D_{cmp}=D_{cmpL}\|D_{cmpH}$), indicating no frequency deviation.

To effectuate both low-side and high-side frequency deviation detection, the clock frequency deviation detector 300 includes reference voltage generators 315-1 and 315-2 configured to generate first and second reference voltages $V_{ref1}$ and $V_{ref2}$, respectively. The first and second reference voltages $V_{ref1}$ and $V_{ref2}$ may be based or derived from the same or different bandgap voltages. As discussed further herein, the first reference voltage $V_{ref1}$ is used for low-side frequency deviation detection, and the second reference voltage $V_{ref2}$ is used for high-side frequency deviation detection. In this regard, the first reference voltage $V_{ref1}$ is greater than the second reference voltage $V_{ref2}$ due to the inverse relationship between frequency and voltage associated with the switched capacitor 310 (e.g., $V_{cap}=I_{dac}/(C*f_{in})$).

The clock frequency deviation detector 300 may also include low-side and high-side comparators 320-1 and 320-2, and a concatenation device 330. The switched capacitor 310 includes an output coupled to positive (+) and negative (−) inputs of the comparators 320-1 and 320-2 to provide switched capacitor voltage $V_{cap}$ thereto, respectively. The reference voltage generator 315-1 includes an output coupled to a negative (−) input of the comparator 320-1 to provide the first reference voltage $V_{ref1}$ thereto. The reference voltage generator 315-2 includes an output coupled to a positive (+) input of the comparator 320-2 to provide the second reference voltage $V_{ref2}$ thereto. The comparator 320-1 includes an output coupled to a first input of the concatenation device 330 to provide thereto a low-side frequency deviation detection signal $D_{cmpL}$. The comparator 320-2 includes an output coupled to a second input of the concatenation device 330 to provide thereto a high-side frequency deviation detection signal $D_{cmpH}$.

The concatenation device 330 is configured to concatenate the low-side and high-side frequency deviation detection signals $D_{cmpL}$ and $D_{cmpH}$ to generate the output frequency deviation detection signal $D_{cmp}$. For example, the concatenation device 330 may be implemented as two parallel transmission lines to form a two-bit data bus with one transmission line for propagating the low-side frequency deviation detection signal $D_{cmpL}$ and the other transmission line for propagating the high-side frequency deviation detection signal $D_{cmpH}$. Similar to the previous implementations, in calibration mode of operation, the switching device $SW_{cal}$ is on or closed, and the switching device $SW_{det}$ is off or open. The closed switching device SW cal routes the comparator output signal $D_{cmp}$ to the input of the SAR circuit 325 for closed-loop calibration purposes. In detection mode of operation, the switching device $SW_{cal}$ is off or open, and the switching device SW det is on or closed. The closed switching device $SW_{det}$ outputs the output frequency deviation detection signal $D_{cmp}$ to an external circuit for frequency deviation monitoring and/or responding purposes.

The calibration of the clock frequency deviation detector 300 may be different than those of the low-side or high-side clock frequency deviation detector 100 or 200. As an example, the calibration of the clock frequency deviation detector 300 may be broken up into three (3) phases: (1) determine the DAC current $I_{dacL}$ corresponding to the low-side frequency threshold by closed-loop successive approximation performed by the SAR circuit 325 with the frequency of the input clock signal $f_{in}$ set to $f_{cal}-\Delta f_1$; (2) determine the DAC current $I_{dacH}$ corresponding to the high-side frequency threshold by closed-loop successive approximation performed by the SAR circuit 325 with the frequency of the input clock signal $f_{in}$ set to $f_{cal}+\Delta f_2$; and (3) determine the final DAC current $I_{dac}$ by setting it to where the target frequency DAC current falls between $I_{dacL}$ and $I_{dacH}$ (e.g., the average of or midpoint between $I_{dacL}$ and $I_{dacH}$, such as $I_{dac}=(I_{dacL}+I_{dacH})/2$; or other). It shall be understood that the low margin of error $\Delta f_1$ may be the same or different than the high margin of error $\Delta f_2$.

Figure 4:
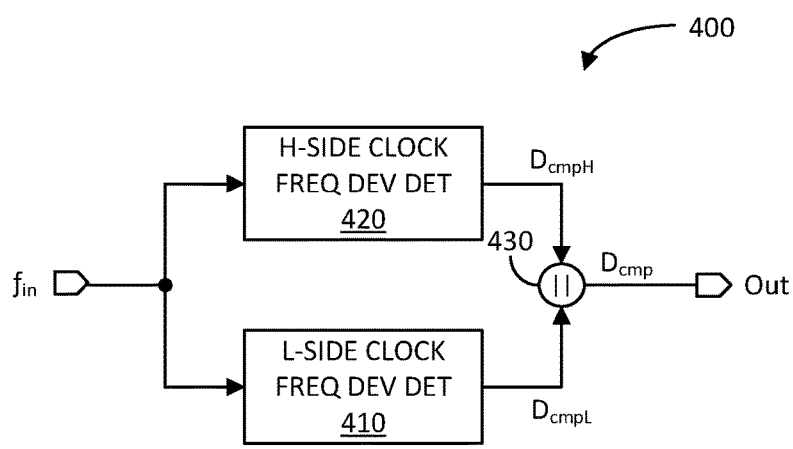
FIG. 4 illustrates a block diagram of another example high-side and low-side clock frequency deviation detector in accordance with another aspect of the disclosure.

FIG. 4 illustrates a block diagram of another example clock frequency deviation detector 400 in accordance with another aspect of the disclosure. The clock frequency deviation detector 400 may be implemented to detect high-side and low-side frequency deviation as in clock frequency deviation detector 300 previously discussed. The two-comparator approach to high-side and low-side frequency deviation detection in clock frequency deviation detector 300 may be suitable if the high and low frequency thresholds $f_{cal}+\Delta f_2$ and $f_{cal}-\Delta f_1$ are not that far apart in frequency. This is because the corresponding variation in the switched capacitor voltage $V_{cap}$ (e.g., due to $V_{cap}$ being inversely related to the frequency of the input clock signal $f_{in}$) may be sufficiently large that would exceed the dynamic range of the comparators 320-1 and 320-2.

Accordingly, the clock frequency deviation detector 400 may be more suitable for high and low frequency thresholds that are significantly far apart (e.g., 300 megaHertz (MHZ) for the low-side threshold, and 800 MHZ for the high-side threshold). In this regard, the clock frequency deviation detector 400 includes a low-side clock frequency deviation detector 410 and a high-side frequency deviation detector 420. The low-side clock frequency deviation detector 410 may be implemented per low-side clock frequency deviation detector 100 previously discussed. The high-side clock frequency deviation detector 420 may be implemented per high-side clock frequency deviation detector 200 previously discussed.

The low- and high-side clock frequency detectors 410 and 420 include a common input configured to receive an input clock signal $f_{in}$. The low-side clock frequency detector 410 is configured to generate a signal $D_{cmpL}$ that indicates whether the frequency $f_{in}$ of the input clock signal is above or below a low-side frequency threshold $f_{calL}$ (e.g., if $f_{in} > f_{calL} \rightarrow D_{cmpL}=0$; and if $f_{in} < f_{calL} \rightarrow D_{cmpL}=1$). Similarly, the high-side clock frequency detector 420 is configured to generate a signal $D_{cmpH}$ that indicates whether the frequency $f_{in}$ of the input clock signal is below or above a high-side frequency threshold $f_{calH}$ (e.g., if $f_{in} < f_{calH} \rightarrow D_{cmpH}=0$; and if $f_{in} > f_{calH} \rightarrow D_{cmpH}=1$). The clock frequency deviation detector 400 further includes a concatenation device 430 configured to concatenate the low-side and high-side frequency deviation detection signals $D_{cmpL}$ and $D_{cmpH}$ to generate an output signal $D_{cmp}$ that indicates whether there is a low-side or high-side frequency deviation.

Figure 5:
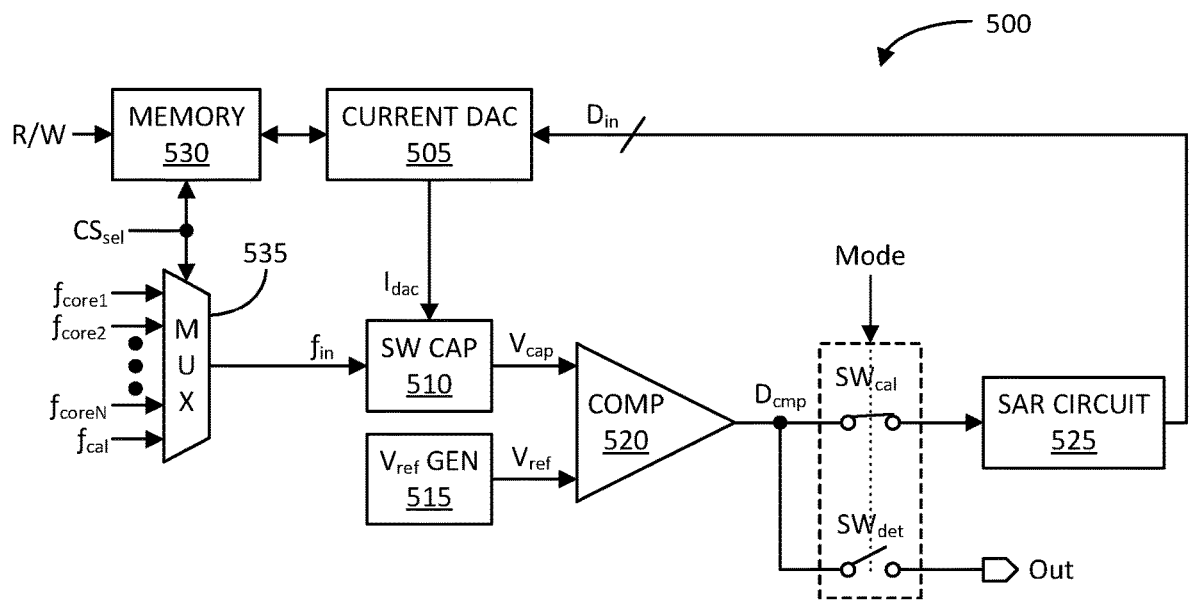
FIG. 5 illustrates a block diagram of an example multi-clock frequency deviation detector in accordance with another aspect of the disclosure.

FIG. 5 illustrates a block diagram of another example clock frequency deviation detector 500 in accordance with another aspect of the disclosure. In the previous implementations 100 to 400, the clock frequency deviation detector was calibrated for a clock signal having a certain target frequency or frequency range. Once the clock frequency deviation detector has been calibrated, a monitored clock signal is provided to the clock frequency deviation detector, which generates a signal indicative of whether the frequency of the monitored clock signal has deviated from the target frequency or frequency range.

In clock frequency deviation detector 500, a set of monitored clock signals $f_{core1}$ to $f_{coreN}$ and a calibration clock signal $f_{cal}$ may be provided as selectable inputs to the clock frequency deviation detector 500. In calibration mode of operation, a first calibration clock signal $f_{cal1}$ with a first target frequency is provided as the selected calibration clock signal $f_{cal}$ for calibrating the detector 500 for monitoring the first monitored clock signal $f_{core1}$. The clock frequency deviation detector 500 may then perform a closed-loop successive approximation to determine a first current DAC input signal $D_{in}$ that causes a switched capacitor voltage $V_{cap}$ to be substantially the same as the reference voltage $V_{ref}$. The first current DAC input signal $D_{in1}$ is then stored in a memory.

Then, a second calibration clock signal fear with a second target frequency is provided as the selected calibration clock signal $f_{cal}$ for calibrating the detector 500 for monitoring the second monitored clock signal $f_{core2}$. The clock frequency deviation detector 500 may then perform a closed-loop successive approximation to determine a second current DAC input signal $D_{in2}$ that causes the switched capacitor voltage $V_{cap}$ to be substantially the same as the reference voltage $V_{ref}$. The second current DAC input signal $D_{in2}$ is then stored in memory. Such calibration algorithm continues until the Nth calibration clock signal $f_{calN}$ with an Nth target frequency is provided as the selected calibration clock signal $f_{cal}$ for calibrating the detector 500 for monitoring the Nth monitored clock signal f coreN. The clock frequency deviation detector 500 may then perform a successive approximation to determine an Nth current DAC input signal $D_{inN}$ that causes the switched capacitor voltage $V_{cap}$ to be substantially the same as the reference voltage $V_{ref}$. The Nth current DAC input signal $D_{inN}$ is then stored in memory.

In detection mode of operation, if the clock frequency deviation detector 500 is to determine whether the frequency of the first monitored clock signal $f_{core1}$ has deviated, the first monitored clock signal $f_{core1}$ is selected as the input clock signal $f_{in}$ for the clock frequency deviation detector 500 and the corresponding DAC input signal $D_{in1}$ is loaded into the current DAC, and the corresponding comparator output signal $D_{cmp}$ indicates whether the frequency $f_{core1}$ is within specification (e.g., $D_{cmp}=0$) or has deviated (e.g., $D_{cmp}=1$). If the clock frequency deviation detector 500 is to determine whether the frequency of the second monitored clock signal $f_{core2}$ has deviated, the second monitored clock signal $f_{core2}$ is selected as the input clock signal $f_{in}$ for the clock frequency deviation detector 500 and the corresponding DAC input signal $D_{in2}$ is loaded into the current DAC, and the corresponding comparator output signal $D_{cmp}$ indicates whether the frequency $f_{core2}$ is within specification (e.g., $D_{cmp}=0$) or has deviated (e.g., $D_{cmp}=1$). Such frequency deviation detection process may continue until the frequency deviation status of the Nth monitored clock signal $f_{coreN}$ has been determined.

More specifically, the clock frequency deviation detector 500 is similar to clock frequency deviation detector 100 or 200, and includes many of the same/similar elements as indicated by the same reference numbers with the exception that the most significant digit is a "5" for clock frequency deviation detector 500 instead of a "1" or "2" for clock frequency deviation detector 100 or 200, respectively.

In addition to the same/similar elements of detector 100 or 200, the clock frequency deviation detector 500 further includes a memory 530 and a multiplexer 535. The multiplexer 535 includes a set of inputs configured to receive the set of monitored clock signals $f_{core1}$ to $f_{coreN}$ and the calibration clock signal $f_{cal}$ (e.g., an external clock signal from an automated test equipment), respectively. The multiplexer 535 further includes a select input configured to receive a clock signal selection signal $CS_{sel}$. Additionally, the multiplexer 535 includes an output coupled to an input of the switched capacitor 510 to provide a selected input clock signal $f_{in}$ thereto. Also, the clock frequency deviation detector 500 includes a memory 530 coupled to the current DAC 505 and configured to receive the clock signal selection signal $CS_{sel}$ and a read/write (R/W) signal.

Thus, as discussed above, when the clock frequency deviation detector 500 is to be calibrated for one of the set of monitored clock signals $f_{core1}$ to $f_{coreN}$ (e.g., $f_{core1}$), the first calibration clock signal $f_{cal1}$ is provided as calibration clock signal input $f_{cal}$ of the multiplexer 535. Also, the clock selection signal $CS_{sel}$ is set to control the multiplexer 535 to output the first calibration clock signal $f_{cal1}$ as the input clock signal $f_{in}$ of the clock frequency deviation detector 500. The clock frequency deviation detector 500 is then operated in calibration mode to perform a closed-loop successive approximation to determine a current DAC input signal $D_{in1}$ that causes the switched capacitor voltage $V_{cap}$ to be substantially the same as the reference voltage $V_{ref}$. The R/W signal is then set to cause the memory 530 to store the current DAC input signal $D_{in1}$ at an address identified by the clock selection signal $CS_{sel}$. Such calibration process continues until all N current DAC input signals $D_{in1}$ to $D_{inN}$ associated with the set of monitored clock signals $f_{core1}$ to $f_{coreN}$ are determined and stored in the memory 530.

In detection mode of operation, the clock signal selection signal $CS_{sel}$ is set to control the multiplexer 535 to output a selected monitored clock signal (e.g., one of $f_{core1}$ to $f_{coreN}$) as the input clock signal $f_{in}$ of the clock frequency deviation detector 500. The R/W signal is also set to load the current DAC input signal associated with the selected monitored clock signal into the current DAC 505 as indicated by the clock selection signal $CS_{sel}$. The clock frequency deviation detector 500 then generates and outputs the frequency deviation detection signal $D_{cmp}$ to an external circuit via the turned-on switching device $SW_{det}$ to determine the frequency deviation status of the selected monitored clock signal. It shall be understood that the clock frequency deviation detector 500 may be implemented to perform high-side and low-side frequency deviation detection per clock frequency deviation detector 300 or 400.

Figure 6:
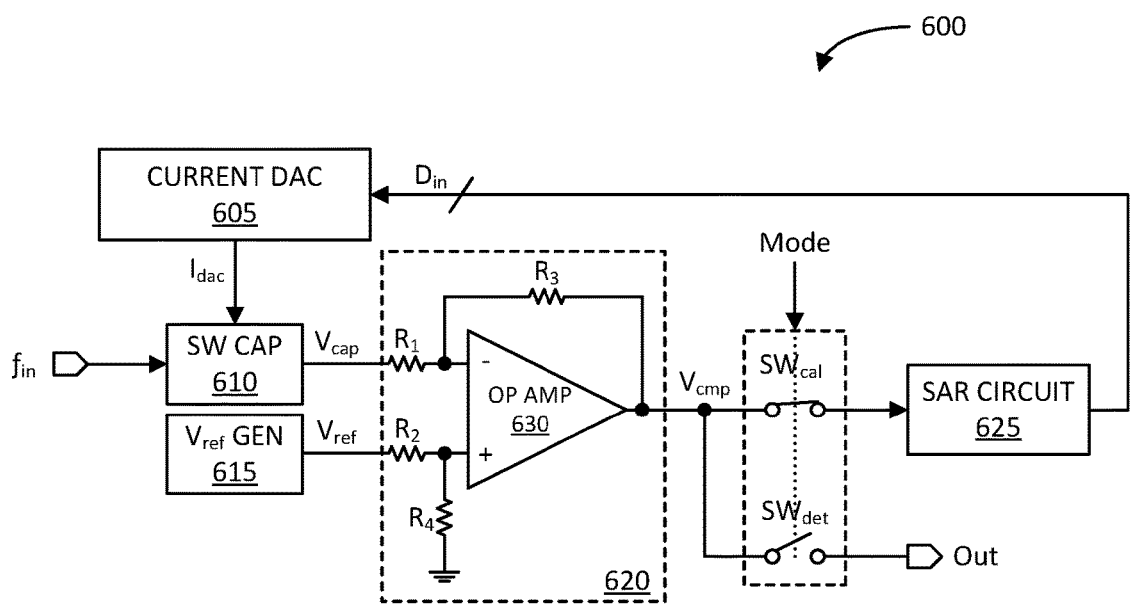
FIG. 6 illustrates a block diagram of an example clock frequency deviation detector in accordance with another aspect of the disclosure.

FIG. 6 illustrates a block diagram of another example clock frequency deviation detector 600 in accordance with another aspect of the disclosure. The clock frequency deviation detector 600 is similar to clock frequency deviation detector 100, and includes many of the same/similar elements as indicated by the same reference numbers with the exception that the most significant digit is a "6" for clock frequency deviation detector 600 instead of a "1" for clock frequency deviation detector 100.

In the previous implementations 100 to 500, the clock frequency deviation detector used a comparator to generate a logical signal $D_{cmp}$ for calibration purposes, as well as to indicate a frequency deviation status of a corresponding monitored clock signal. In contrast, the clock frequency deviation detector 600 includes a differential amplifier 620 configured to generate an analog signal $V_{cmp}$ for calibration purposes, as well as information about a frequency deviation of a corresponding monitored clock signal. Once calibrated, the analog signal $V_{cmp}$ indicates the amount of frequency deviation as a function of a gain G of the differential amplifier 620 and the difference between the switched capacitor voltage $V_{cap}$ and the reference voltage $V_{ref}$ (e.g., $V_{cmp}=G*(V_{cap}-V_{ref})$).

In this example, the differential amplifier 620 includes an operational amplifier 630 including negative (−) and positive (+) inputs and an output. The differential amplifier 620 further includes a pair of input resistors $R_1$ and $R_2$ coupled between the switched capacitor 610 and the reference voltage generator 615 and the negative (−) and positive (+) inputs of the operational amplifier 630, respectively. Additionally, the differential amplifier 630 includes a feedback resistor $R_3$ coupled between the output and the negative (−) input of the operational amplifier 630. Further, the differential amplifier 630 includes a shunt resistor $R_4$ coupled between the positive (+) input of the operational amplifier 630 and a lower voltage rail (e.g., ground). The gain G of the differential amplifier 620 is determined by the resistances of the resistors $R_1$ to $R_4$ (e.g., $V_{cmp}=G*(V_{cap}-V_{ref})$, where $G=-R_3/R_1$ when $R_1=R_2$ and $R_3=R_4$). It shall be understood that the differential amplifier 620 may have a different implementation.

In calibration mode of operation, the clock frequency deviation detector 600 operates similar to detector 100 with the exception that the SAR circuit 625 performs a closed-loop successive approximation of the current DAC input signal $D_{in}$ based on the analog signal $V_{cmp}$. In detection mode of operation, an external circuit may receive the analog signal $V_{cmp}$ and determine the frequency deviation status of the monitored clock signal based on the magnitude or amplitude of the analog signal $V_{cmp}$. The comparators of detectors 100-500 and the differential amplifier 620 of detector 600 may be generally referred to voltage comparing devices.

Figure 7:
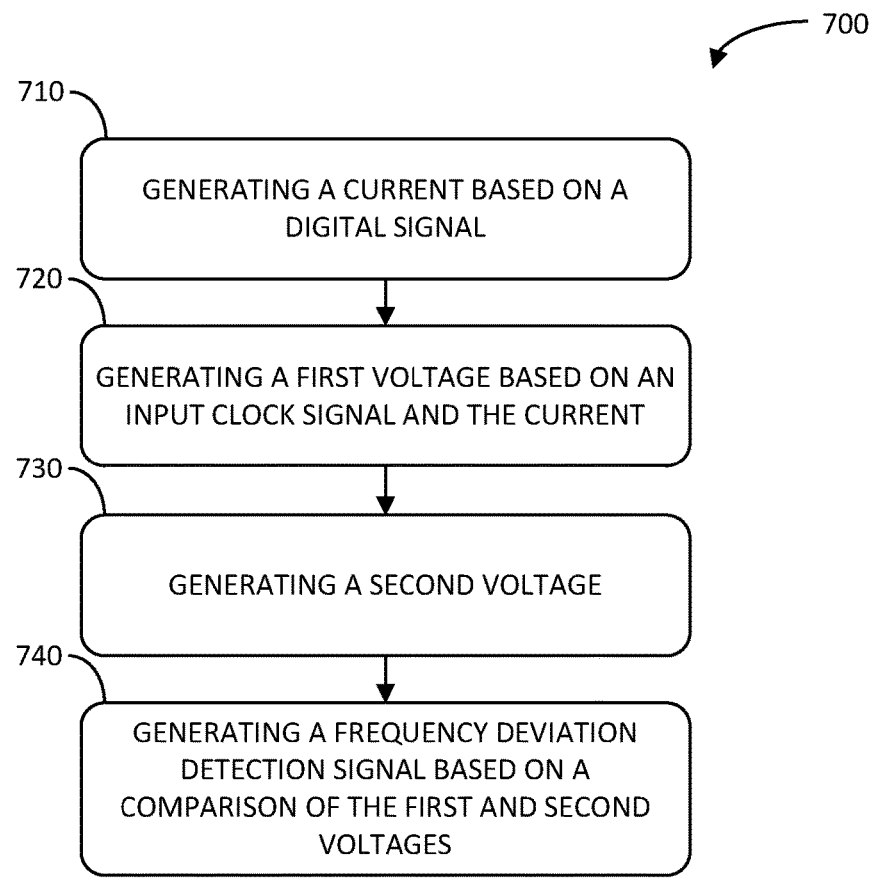
FIG. 7 illustrates a flow diagram of another example method of generating a frequency deviation detection signal in accordance with another aspect of the disclosure.

FIG. 7 illustrates a flow diagram of another example method 700 of generating a frequency deviation detection signal in accordance with another aspect of the disclosure. The method 700 includes generating a current based on a digital signal (block 710). Examples of means for generating a current based on a digital signal include any of the current DACs described herein. Additionally, the method 700 includes generating a first voltage based on an input clock signal and the current (block 720). Examples of means for generating a first voltage based on an input clock signal and the current include any of the switched capacitors described herein.

Further, the method 700 includes generating a second voltage (block 730). Examples of means for generating a second voltage include any of the reference voltage generators described herein. Also, the method 700 includes generating a first frequency deviation detection signal based on a comparison of the first and second voltages (block 740). Examples of means for generating a first frequency deviation detection signal based on a comparison of the first and second voltages include any of the comparators or differential amplifier described herein.

Figure 8:
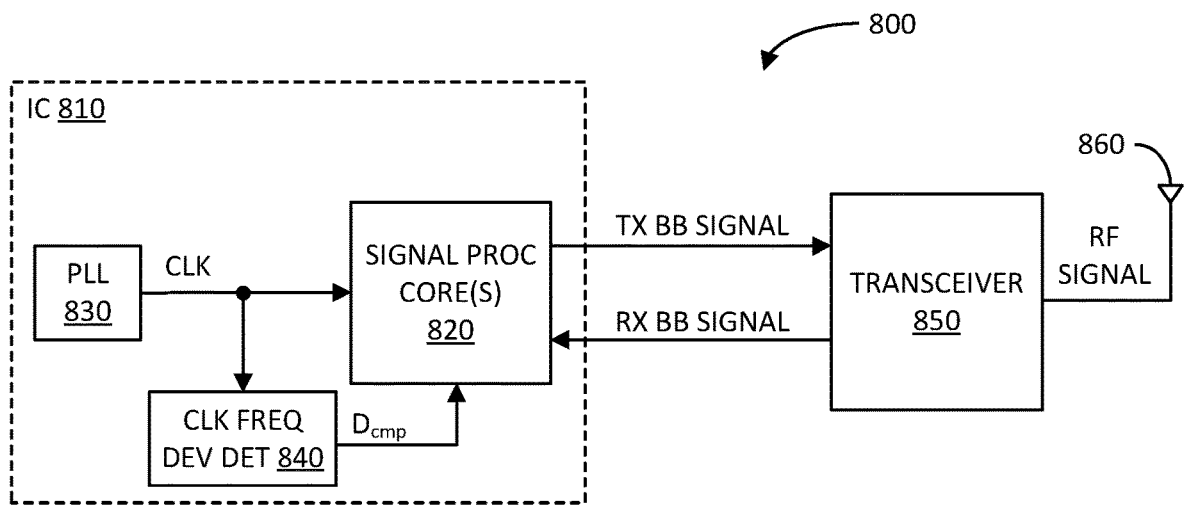
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device 800 may be a smart phone, a desktop computer, laptop computer, tablet device, Internet of Things (IoT), wearable wireless device (e.g., wireless watch), and other types of wireless device.

In particular, the wireless communication device 800 includes an integrated circuit (IC) 810, which may be implemented as a system on chip (SOC). The IC 810 includes one or more signal processing cores 820 configured to generate a transmit (Tx) baseband (BB) signal and process a received (Rx) baseband (BB) signal. The IC 810 further includes a phase lock loop (PLL) 830 as a clock source configured to generate a clock signal CLK. The clock signal CLK may be provided to the one or more signal processing cores 820 for generating the Tx BB signal and processing the Rx BB signal.

Additionally, the IC 810 further includes a clock frequency deviation detector 840 configured to generate a frequency deviation detection signal $D_{cmp}$ based on the frequency of the clock signal CLK, as previously discussed. The clock frequency deviation detector 840 may be implemented per any of the clock frequency deviation detectors previously discussed. The frequency deviation detection signal $D_{cmp}$ may be provided to the one or more signal processing cores 820 and/or other core/circuit/device for frequency deviation monitoring and/or responding thereto.

The wireless communication device 800 may further include a transceiver 850 and at least one antenna 860 (e.g., an antenna array). The transceiver 850 is coupled to the one or more signal processing cores 820 to receive therefrom the Tx BB signal and provide thereto the Rx BB signal. The transceiver 850 is configured to convert the Tx BB signal into a transmit (Tx) radio frequency (RF) signal, and convert a received (Rx) RF signal into the Rx BB signal. The transceiver 850 is coupled to the at least one antenna 860 to provide thereto the Tx RF signal for electromagnetic radiation into a wireless medium for wireless transmission, and receive the Rx RF signal electromagnetically picked up from the wireless medium by the at least one antenna 860.

The following provides an overview of aspects of the present disclosure:

Aspect 1: An apparatus, comprising: a switched capacitor configured to generate a switched capacitor voltage based on an input clock signal and a current; a current digital-to-analog converter (DAC) configured to generate the current based on a first digital signal; a first reference voltage generator configured to generate a first reference voltage; and a first voltage comparing device configured to generate a first frequency deviation detection signal based on a comparison of the switched capacitor voltage to the first reference voltage.

Aspect 2: The apparatus of aspect 1, wherein the first voltage comparing device comprises a comparator.

Aspect 3: The apparatus of aspect 2, wherein the comparator comprises a hysteresis comparator.

Aspect 4: The apparatus of aspect 1, wherein the first voltage comparing device comprises a differential amplifier.

Aspect 5: The apparatus of any one of aspects 1-4, wherein the first reference voltage generator comprises a bandgap voltage generator.

Aspect 6: The apparatus of any one of aspects 1-5, further comprising a successive approximation register (SAR) circuit configured to generate the first digital signal based on the first frequency deviation detection signal.

Aspect 7: The apparatus of aspect 6, further comprising: a first switching device coupled between the first voltage comparing device and the SAR circuit, wherein an on/off state of the first switching device is responsive to a mode signal; and a second switching device coupled between the first voltage comparing device and an output, wherein an on/off state of the second switching device is responsive to the mode signal.

Aspect 8: The apparatus of aspect 7, wherein the first switching device is on and the second switching device is off in response to the mode signal indicating a calibration mode of operation.

Aspect 9: The apparatus of aspect 8, wherein, in the calibration mode of operation while the input clock signal comprising a calibration clock signal, the SAR circuit is configured to perform a successive approximation of the first digital signal until the switched capacitor voltage is substantially equal to the first reference voltage.

Aspect 10: The apparatus of aspect 9, wherein the first switching device is off and the second switching device is on in response to the mode signal indicating a detection mode of operation, wherein the input clock signal comprises a monitored clock signal during the detection mode of operation, and wherein the first frequency deviation detection signal indicates a frequency deviation status or amount between a frequency of the calibration clock signal and a frequency of the monitored clock signal.

Aspect 11: The apparatus of aspect 10, wherein the first frequency deviation detection signal indicates: a no frequency deviation status when the switched capacitor voltage is less than the first reference voltage; and a frequency deviation status when the switched capacitor voltage is greater than the first reference voltage.

Aspect 12: The apparatus of aspect 10, wherein the first frequency deviation detection signal indicates: a no frequency deviation status when the switched capacitor voltage is greater than the first reference voltage; and a frequency deviation status when the switched capacitor voltage is less than the first reference voltage.

Aspect 13: The apparatus of any one of aspects 1-12, further comprising: a second reference voltage generator configured to generate a second reference voltage; and a second voltage comparing device configured to generate a second frequency deviation detection signal based on a comparison of the switched capacitor voltage to the second reference voltage.

Aspect 14: The apparatus of aspect 13, wherein: the first frequency deviation detection signal indicates a low-side frequency deviation status when the switched capacitor voltage is greater than the first reference voltage; and the second frequency deviation detection signal indicates a high-side frequency deviation status when the switched capacitor voltage is less than the second reference voltage.

Aspect 15: The apparatus of aspect 14, further comprising a concatenation device configured to generate a third frequency deviation detection signal including a concatenation of the first frequency deviation detection signal and the second frequency deviation detection signal.

Aspect 16: The apparatus of any one of aspect 1-15, further comprising a multiplexer including a set of inputs configured to receive a set of monitored clock signals and a calibration clock signal, and an output configured to generate the input clock signal based on a clock signal select signal.

Aspect 17: The apparatus of aspect 16, wherein the current DAC is configured to generate the current based on the clock signal select signal.

Aspect 18: The apparatus of aspect 17, further comprising a memory configured to store a set of digital signals including the first digital signal, wherein the memory is configured to provide the first digital signal to the current DAC based on the clock signal select signal.

Aspect 19: The apparatus of aspect 18, further comprising a successive approximation register (SAR) circuit configured to generate the set of digital signals based on a set of calibration clock signals including a set of target frequencies for the set of monitored clock signals, respectively.

Aspect 20: A method, comprising: generating a current based on a digital signal; generating a first voltage based on an input clock signal and the current; generating a second voltage; and generating a first frequency deviation detection signal based on a comparison of the first and second voltages.

Aspect 21: The method of aspect 20, further comprising performing a successive approximation of the digital signal until the first voltage is substantially equal to the second voltage.

Aspect 22: The method of aspect 20 or 21, wherein generating the first frequency deviation detection signal comprises generating the first frequency deviation detection signal with a first logic value in response to the first voltage being less than the second voltage, and with a second logic value complementary to the first logic value in response to the first voltage being greater than the second voltage.

Aspect 23: The method of aspect 20 or 21, wherein generating the first frequency deviation detection signal comprises generating the first frequency deviation detection signal based on a difference between the first voltage and the second voltage.

Aspect 24: The method of any one of aspects 20-23, further comprising: generating a set of one or more voltages based on a set of one or more input clock signals and a set of one or more currents, respectively; and generating a set of one or more frequency deviation detection signals based on a comparison of the set of one or more voltages to the second voltage, respectively.

Aspect 25: An apparatus, comprising: means for generating a current based on a digital signal; means for generating a first voltage based on an input clock signal and the current; means for generating a second voltage; and means for generating a first frequency deviation detection signal based on a comparison of the first and second voltages.

Aspect 26: The apparatus of aspect 25, further comprising means for performing a successive approximation of the digital signal until the first voltage is substantially equal to the second voltage.

Aspect 27: The apparatus of aspect 25 or 26, wherein the means for generating the first frequency deviation detection signal comprises means for generating the first frequency deviation detection signal with a first logic value in response to the first voltage being less than the second voltage, and with a second logic value complementary to the first logic value in response to the first voltage being greater than the second voltage.

Aspect 28: The apparatus of aspect 25 or 26, wherein the means for generating the first frequency deviation detection signal comprises means for generating the first frequency deviation detection signal based on a difference between the first voltage and the second voltage.

Aspect 29: The apparatus of any one of aspects 25-28, further comprising: means for generating a set of one or more voltages based on a set of one or more input clock signals and a set of one or more currents, respectively; and means for generating a set of one or more frequency deviation detection signals based on a comparison of the set of one or more voltages to the second voltage, respectively.

Aspect 30: A wireless communication device, comprising: at least one antenna; a transceiver coupled to the at least one antenna; a set of one or more signal processing cores coupled to the transceiver; a clock source coupled to the set of one or more signal processing cores; and a frequency deviation detector coupled to the clock source, wherein the frequency deviation detector comprises: a switched capacitor configured to generate a switched capacitor voltage based on an input clock signal and a current; a current digital-to-analog converter (DAC) configured to generate the current based on a first digital signal; a reference voltage generator configured to generate a reference voltage; and a voltage comparing device configured to generate a frequency deviation detection signal based on a comparison of the switched capacitor voltage to the reference voltage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a switched capacitor configured to generate a switched capacitor voltage based on an input clock signal and a current;
a current digital-to-analog converter (DAC) configured to generate the current based on a first digital signal;
a first reference voltage generator configured to generate a first reference voltage; and
a first voltage comparing device configured to generate a first frequency deviation detection signal based on a comparison of the switched capacitor voltage to the first reference voltage.

2. The apparatus of claim 1, wherein the first voltage comparing device comprises a comparator.

3. The apparatus of claim 2, wherein the comparator comprises a hysteresis comparator.

4. The apparatus of claim 1, wherein the first voltage comparing device comprises a differential amplifier.

5. The apparatus of claim 1, wherein the first reference voltage generator comprises a bandgap voltage generator.

6. The apparatus of claim 1, further comprising a successive approximation register (SAR) circuit configured to generate the first digital signal based on the first frequency deviation detection signal.

7. The apparatus of claim 6, further comprising:
a first switching device coupled between the first voltage comparing device and the SAR circuit, wherein an on/off state of the first switching device is responsive to a mode signal; and
a second switching device coupled between the first voltage comparing device and an output, wherein an on/off state of the second switching device is responsive to the mode signal.

8. The apparatus of claim 7, wherein the first switching device is on and the second switching device is off in response to the mode signal indicating a calibration mode of operation.

9. The apparatus of claim 8, wherein, in the calibration mode of operation while the input clock signal comprises a calibration clock signal, the SAR circuit is configured to perform a successive approximation of the first digital signal until the switched capacitor voltage is substantially equal to the first reference voltage.

10. The apparatus of claim 9, wherein the first switching device is off and the second switching device is on in response to the mode signal indicating a detection mode of operation, wherein the input clock signal comprises a monitored clock signal during the detection mode of operation, and wherein the first frequency deviation detection signal indicates a frequency deviation status or amount between a frequency of the calibration clock signal and a frequency of the monitored clock signal.

11. The apparatus of claim 10, wherein the first frequency deviation detection signal indicates:
a no frequency deviation status when the switched capacitor voltage is less than the first reference voltage; and
a frequency deviation status when the switched capacitor voltage is greater than the first reference voltage.

12. The apparatus of claim 10, wherein the first frequency deviation detection signal indicates:
a no frequency deviation status when the switched capacitor voltage is greater than the first reference voltage; and
a frequency deviation status when the switched capacitor voltage is less than the first reference voltage.

13. The apparatus of claim 1, further comprising:
a second reference voltage generator configured to generate a second reference voltage; and
a second voltage comparing device configured to generate a second frequency deviation detection signal based on a comparison of the switched capacitor voltage to the second reference voltage.

14. The apparatus of claim 13, wherein:
the first frequency deviation detection signal indicates a low-side frequency deviation status when the switched capacitor voltage is greater than the first reference voltage; and
the second frequency deviation detection signal indicates a high-side frequency deviation status when the switched capacitor voltage is less than the second reference voltage.

15. The apparatus of claim 14, further comprising a concatenation device configured to generate a third frequency deviation detection signal including a concatenation of the first frequency deviation detection signal and the second frequency deviation detection signal.

16. The apparatus of claim 1, further comprising a multiplexer including a set of inputs configured to receive a set of monitored clock signals and a calibration clock signal, and an output configured to generate the input clock signal based on a clock signal select signal.

17. The apparatus of claim 16, wherein the current DAC is configured to generate the current based on the clock signal select signal.

18. The apparatus of claim 17, further comprising a memory configured to store a set of digital signals including the first digital signal, wherein the memory is configured to provide the first digital signal to the current DAC based on the clock signal select signal.

19. The apparatus of claim 18, further comprising a successive approximation register (SAR) circuit configured to generate the set of digital signals based on a set of calibration clock signals including a set of target frequencies for the set of monitored clock signals, respectively.

20. A method, comprising:
generating a current based on a digital signal;
generating a first voltage based on an input clock signal and the current;
generating a second voltage;
generating a first frequency deviation detection signal based on a comparison of the first and second voltages; and
performing a successive approximation of the digital signal until the first voltage is substantially equal to the second voltage.

21. The method of claim 20, wherein generating the first frequency deviation detection signal comprises generating the first frequency deviation detection signal with a first logic value in response to the first voltage being less than the second voltage, and with a second logic value complementary to the first logic value in response to the first voltage being greater than the second voltage.

22. The method of claim 20, wherein generating the first frequency deviation detection signal comprises generating the first frequency deviation detection signal based on a difference between the first voltage and the second voltage.

23. The method of claim 20, further comprising:
generating a set of one or more voltages based on a set of one or more input clock signals and a set of one or more currents, respectively; and
generating a set of one or more frequency deviation detection signals based on a comparison of the set of one or more voltages to the second voltage, respectively.

24. An apparatus, comprising:
means for generating a current based on a digital signal;
means for generating a first voltage based on an input clock signal and the current;
means for generating a second voltage; and
means for generating a first frequency deviation detection signal based on a comparison of the first and second voltages.

25. The apparatus of claim 24, further comprising means for performing a successive approximation of the digital signal until the first voltage is substantially equal to the second voltage.

26. The apparatus of claim 24, wherein the means for generating the first frequency deviation detection signal comprises means for generating the first frequency deviation detection signal with a first logic value in response to the first voltage being less than the second voltage, and with a second logic value complementary to the first logic value in response to the first voltage being greater than the second voltage.

27. The apparatus of claim 24, wherein the means for generating the first frequency deviation detection signal comprises means for generating the first frequency deviation detection signal based on a difference between the first voltage and the second voltage.

28. The apparatus of claim 24, further comprising:
means for generating a set of one or more voltages based on a set of one or more input clock signals and a set of one or more currents, respectively; and
means for generating a set of one or more frequency deviation detection signals based on a comparison of the set of one or more voltages to the second voltage, respectively.

29. A wireless communication device, comprising:
at least one antenna;
a transceiver coupled to the at least one antenna;
a set of one or more signal processing cores coupled to the transceiver;
a clock source coupled to the set of one or more signal processing cores; and
a frequency deviation detector coupled to the clock source, wherein the frequency deviation detector comprises:
a switched capacitor configured to generate a switched capacitor voltage based on an input clock signal and a current;
a current digital-to-analog converter (DAC) configured to generate the current based on a digital signal;
a reference voltage generator configured to generate a reference voltage; and
a voltage comparing device configured to generate a frequency deviation detection signal based on a comparison of the switched capacitor voltage to the reference voltage.

* * * * *